(12) United States Patent
Ito et al.

(10) Patent No.: US 12,010,921 B2
(45) Date of Patent: Jun. 11, 2024

(54) PIEZOELECTRIC ELEMENT WITH LITHIUM MANGANATE-CONTAINING CERAMIC LAYERS AND SILVER-CONTAINING INTERNAL ELECTRODES

(71) Applicant: TAIYO YUDEN CO., LTD., Tokyo (JP)

(72) Inventors: Ryo Ito, Takasaki (JP); Takayuki Goto, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 662 days.

(21) Appl. No.: 17/202,115

(22) Filed: Mar. 15, 2021

(65) Prior Publication Data

US 2021/0305490 A1   Sep. 30, 2021

(30) Foreign Application Priority Data

Mar. 27, 2020   (JP) .................................. 2020-057955

(51) Int. Cl.
*H10N 30/853*   (2023.01)
*C04B 35/495*   (2006.01)
(Continued)

(52) U.S. Cl.
CPC ....... *H10N 30/8536* (2023.02); *C04B 35/495* (2013.01); *C04B 35/6261* (2013.01);
(Continued)

(58) Field of Classification Search
CPC .. H10N 30/8536; H10N 30/053; H10N 30/50; H10N 30/871; H10N 30/877;
(Continued)

(56) References Cited

U.S. PATENT DOCUMENTS 6,221,271 B1   4/2001   Watanabe et al.
8,076,828 B2 *  12/2011   Kawada ............... H10N 30/053
                                                        252/62.9 PZ
(Continued)

FOREIGN PATENT DOCUMENTS

CN   1474467 A    2/2004
CN   103579494 A  2/2014
(Continued)

OTHER PUBLICATIONS

A First Office Action issued by the State Intellectual Property Office of China on Dec. 27, 2023, for Chinese counterpart application No. 202110279425.0 (10 pages).

*Primary Examiner* — Emily P Pham
(74) *Attorney, Agent, or Firm* — Law Office of Katsuhiro Arai

(57) ABSTRACT

A multilayer piezoelectric element using an alkaline niobate-based piezoelectric ceramic, which can inhibit its reliability from dropping while lowering production cost, is characterized by forming internal electrodes (10) with a metal whose silver content is 80 percent by mass or higher, and also constituting piezoelectric ceramic layers (40) with a piezoelectric ceramic whose primary component is an alkaline niobate having a perovskite structure and which also contains a lithium manganate.

8 Claims, 2 Drawing Sheets

(51) Int. Cl.
*C04B 35/626* (2006.01)
*C04B 35/634* (2006.01)
*C04B 35/64* (2006.01)
*C04B 37/00* (2006.01)
*H10N 30/053* (2023.01)
*H10N 30/50* (2023.01)
*H10N 30/87* (2023.01)

(52) U.S. Cl.
CPC .......... *C04B 35/6342* (2013.01); *C04B 35/64* (2013.01); *C04B 37/003* (2013.01); *H10N 30/053* (2023.02); *H10N 30/50* (2023.02); *H10N 30/871* (2023.02); *H10N 30/877* (2023.02); *C04B 2235/3255* (2013.01); *C04B 2235/3268* (2013.01); *C04B 2235/3418* (2013.01); *C04B 2235/442* (2013.01); *C04B 2235/6025* (2013.01); *C04B 2237/125* (2013.01); *C04B 2237/348* (2013.01); *C04B 2237/68* (2013.01)

(58) Field of Classification Search
CPC ............. H10N 30/097; H10N 30/8542; H10N 30/057; H10N 30/06; H10N 30/853; C04B 35/495; C04B 35/6261; C04B 35/6342; C04B 35/64; C04B 35/622; C04B 2235/3255; C04B 2235/3268; C04B 2235/3418; C04B 2235/442; C04B 2235/6025; C04B 2235/3201; C04B 2235/3203; C04B 2235/3208; C04B 2235/3213; C04B 2235/3215; C04B 2235/3251; C04B 2235/3262; C04B 2235/3291; C04B 2235/3294; C04B 2235/604; C04B 2235/612; C04B 2235/6567; C04B 2235/768; C04B 2235/80; C04B 37/003; C04B 2237/125; C04B 2237/348; C04B 2237/68
See application file for complete search history.

(56) References Cited

U.S. PATENT DOCUMENTS

| | | |
|---|---|---|
| 2004/0129919 A1 | 7/2004 | Horikawa et al. |
| 2008/0290316 A1 | 11/2008 | Katayama et al. |
| 2014/0028156 A1 | 1/2014 | Shimizu et al. |
| 2016/0351789 A1 | 12/2016 | Watanabe et al. |
| 2016/0365502 A1 | 12/2016 | Saito et al. |
| 2017/0059378 A1* | 3/2017 | Nagareda ................ G01F 1/667 |
| 2017/0263845 A1 | 9/2017 | Hatano et al. |
| 2018/0259471 A1* | 9/2018 | Asiri .................... G01N 27/126 |

FOREIGN PATENT DOCUMENTS

| | | |
|---|---|---|
| CN | 105939983 A | 9/2016 |
| CN | 106029605 A | 10/2016 |
| CN | 107180911 A | 9/2017 |
| JP | 2012254912 A | 12/2012 |
| JP | 2017163055 A | 9/2017 |
| WO | 2007094115 A1 | 8/2007 |
| WO | 2023063007 A1 | 4/2023 |

* cited by examiner

PIEZOELECTRIC ELEMENT WITH LITHIUM MANGANATE-CONTAINING CERAMIC LAYERS AND SILVER-CONTAINING INTERNAL ELECTRODES

CROSS-REFERENCE TO RELATED APPLICATIONS

The present application claims priority to Japanese Patent Application No. 2020-057955, filed Mar. 27, 2020, the disclosure of which is incorporated herein by reference in its entirety including any and all particular combinations of the features disclosed therein.

BACKGROUND

Field of the Invention

The present invention relates to a piezoelectric element and a method for manufacturing the same.

Description of the Related Art

A piezoelectric element is an electronic component having a structure in which a ceramic with piezoelectricity (piezoelectric ceramic) is sandwiched between a pair of electrodes. Here, "piezoelectricity" refers to a property that allows for interconversion of electrical energy and mechanical energy.

Utilizing the aforementioned property of piezoelectric ceramics, piezoelectric elements can convert the voltage impressed between a pair of electrodes to mechanical energy, such as pressure or vibration, and thereby move themselves or other objects. On the other hand, piezoelectric elements can also convert mechanical energy, such as vibration or pressure, to electrical energy and retrieve the electrical energy as voltage between a pair of electrodes.

When converting the voltage impressed between electrodes to mechanical vibration, piezoelectric elements can generate vibrations in a wide range of frequencies. To be specific, they can generate vibrations, for example, in a frequency band of approx. 1 to 100 Hz representing the so-called "low-frequency sounds," in a frequency band of approx. 20 Hz to 20 kHz representing the sounds perceptible by humans, in a frequency band of 20 kHz to several GHz representing the so-called "ultrasonic waves," and in a frequency band of around several to several tens of GHz representing the electromagnetic waves. This is why piezoelectric elements are used in speakers and other vibration components. On the other hand, piezoelectric elements can also sense vibrations in the various frequency bands mentioned above and generate voltages in a wide range of corresponding frequency bands.

Known structures of piezoelectric elements include one characterized by electrodes formed only on the piezoelectric ceramic surface, and the so-called "multilayer piezoelectric element" type comprising a stack of multiple piezoelectric ceramic layers sandwiched between internal electrodes. Multilayer piezoelectric elements can achieve large displacements in the stacking direction of piezoelectric ceramic layers, and thus can be utilized for actuators, etc., for example. Typically, multilayer piezoelectric elements are manufactured through simultaneous firing of piezoelectric ceramic layers and internal electrodes.

Widely used as piezoelectric ceramics that constitute these piezoelectric elements, are ones whose primary component is lead zirconate titanate ($Pb(Zr,Ti)O_3$, PZT) or solid solution thereof. PZT-based piezoelectric ceramics have advantages in that, because their Curie temperatures are high, they can be used to obtain piezoelectric elements that are usable even in a high-temperature environment, and also because their electromechanical coupling coefficients are high, they can be used to obtain piezoelectric elements that allow for efficient conversion of electrical energy and mechanical energy. Furthermore, these piezoelectric ceramics have another advantage in that, in appropriately selected compositions, they can be fired at temperatures below 1000° C. and thus can lower the manufacturing cost of piezoelectric elements. Particularly in the case of the aforementioned multilayer piezoelectric elements, these piezoelectric ceramics allow for use of low-melting-point materials that have a higher content percentage of silver, or specifically materials that have lower content percentages of platinum, palladium, and other expensive ingredients, for the internal electrodes that are simultaneously fired with the piezoelectric ceramics, which produces a significant cost reduction effect.

However, PZT-based piezoelectric ceramics present a problem in that they contain lead, which is a toxic substance, and therefore a need exists for lead-free piezoelectric ceramic compositions to replace PZT-based piezoelectric ceramics.

Lead-free piezoelectric ceramics based on alkaline niobates ($(Li, Na, K)NbO_3$), bismuth-sodium titanate ($(Bi_{0.5}Na_{0.5})TiO_3$, BNT), bismuth layered compounds, tungsten bronze and various other compositions, have been heretofore reported. Among these, alkaline niobate-based piezoelectric ceramics have high Curie temperatures as well as relatively high electromechanical coupling coefficients, and are thus drawing attention as alternatives to their PZT-based counterparts (Patent Literature 1).

Attempts are made to allow for low-temperature firing of these alkaline niobate-based piezoelectric ceramics so that they can be sintered integrally with internal electrodes having a high content percentage of silver, to reduce the manufacturing cost of multilayer piezoelectric elements. For example, Patent Literature 2 reports that, by using an alkaline niobate-based piezoelectric ceramic whose composition contains an alkaline earth metal and silver, it can be integrally fired with internal electrodes of Ag 0.7-Pd 0.3. Also, Patent Literature 2 reports that the obtained multilayer piezoelectric elements exhibited high electrical resistivity.

Background Art Literatures

[Patent Literature 1] International Patent Laid-open No. 2007/094115

[Patent Literature 2] Japanese Patent Laid-open No. 2017-163055

SUMMARY

In recent years, there has been a call for further reduction of the manufacturing cost of multilayer piezoelectric elements, and studies are being conducted to constitute internal electrodes with a metal whose silver content is 80 percent by mass or higher.

In this case, the piezoelectric ceramic that forms the piezoelectric ceramic layers must permit firing at a lower temperature in order for them to be integrally fired with, and without melting, the internal electrodes whose melting point is now lower compared to when metals whose silver content is 70 percent by mass or lower are used. However, an increase in the content percentage of silver in the internal electrodes also increases the quantity of silver that diffuses into the piezoelectric ceramic layers during firing, and as this diminishes the sintering property of the piezoelectric ceramic layers, the aforementioned low-temperature firing becomes difficult. In addition, diffusion of silver into the piezoelectric ceramic layers, and the resulting drop in their sintering property, can both lower the electrical resistance of the piezoelectric ceramic layers and cause the reliability of the multilayer piezoelectric element to drop, which is a problem.

Patent Literature 2 describes that the sintering property can be improved when $Li_2O$ and $SiO_2$ are contained in the aforementioned alkaline niobate-based piezoelectric ceramic. Depending on the contents of these components, however, the generating quantity of conductive $Li_3NbO_4$ could increase and the insulating property, drop.

Additionally, Patent Literature 2 also describes that, as Mn atoms form a substitutional solid solution in the alkaline niobate or are taken up by its lattice, drop in the electrical resistance of the piezoelectric ceramic can be inhibited. However, it is not yet confirmed that adding Mn lowers the firing temperature.

Accordingly, an object of the present invention is to solve these problems and provide a multilayer piezoelectric element using an alkaline niobate-based piezoelectric ceramic in a manner inhibiting its reliability from dropping and also at low cost. It should be noted that any discussion of problems and solutions in relation to the related art has been included in this disclosure solely for the purposes of providing a context for the present invention, and should not be taken as an admission that any or all of the discussion was known at the time the invention was made. Further, the present invention is distinguished from the above-discussed related art, and in order to clarify the distinctions, any elements taught in the related art can expressly be excluded from optional elements otherwise usable in the present invention, and to that extent, the disclosure of the related art is herein incorporated by reference.

After conducting various studies to achieve the aforementioned object, the inventor of the present invention found that the object could be achieved when the multilayer piezoelectric element has piezoelectric ceramic layers that contain lithium manganate in addition to an alkaline niobate being a primary component, and consequently completed the present invention.

To be specific, an aspect of the present invention to achieve the aforementioned object is a multilayer piezoelectric element characterized in that it comprises: piezoelectric ceramic layers constituted by a piezoelectric ceramic whose primary component is an alkaline niobate having a perovskite structure and which further contains lithium manganate; and internal electrodes formed by a metal whose silver content is 80 percent by mass or higher, and provided between the piezoelectric ceramic layers.

Additionally, another aspect of the present invention is a method for manufacturing a multilayer piezoelectric element, which includes: preparing green sheets that contain a powder of an alkaline niobate having a perovskite structure, at least one type of manganese compound selected from manganese oxide, manganese carbonate, manganese acetate, and lithium manganate, and an organic binder; placing, on the green sheets, precursors to internal electrodes that contain a metal whose silver content is 80 percent by mass or higher; stacking the green sheets on which the precursors to internal electrodes have been placed, to produce a laminate body; and firing the laminate body to obtain a fired body constituted by internal electrodes provided between sintered body layers whose primary component is the alkaline niobate and which further contains lithium manganate.

According to the present invention, a multilayer piezoelectric element using an alkaline niobate-based piezoelectric ceramic can be provided in a manner inhibiting its reliability from dropping and also at low cost.

DESCRIPTION OF THE SYMBOLS

Figure 1:
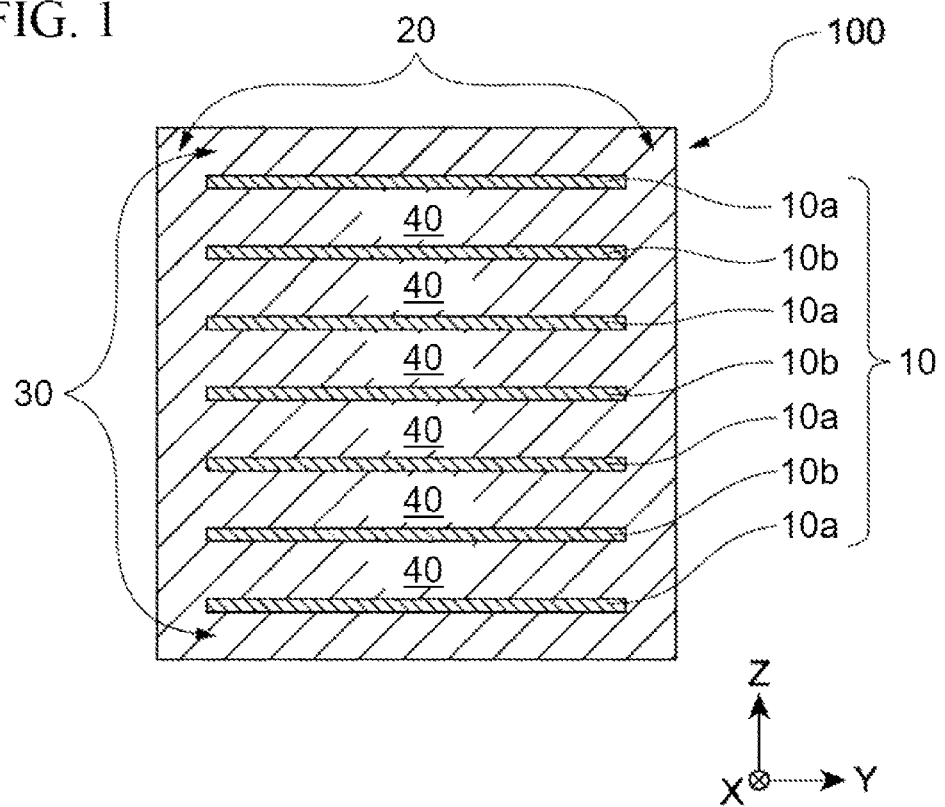
FIG. 1 is a cross-sectional view showing the structure of the multilayer piezoelectric element pertaining to an aspect of the present invention.

100 Multilayer piezoelectric element
10 Internal electrode
20 Side margin part
30 Cover part
40 Piezoelectric ceramic layer

DETAILED DESCRIPTION OF EMBODIMENTS

The constitutions as well as operations and effects of the present invention are explained below, together with the technical concepts, by referring to the drawings. It should be noted, however, that the mechanisms of operations include estimations, and whether they are correct or wrong does not limit the present invention in any way. Also, of the components in the aspects below, those components described in an aspect but not in another aspect are alternative, additional, or optional components and can be positively excluded from the another aspect or can be replaced with any components equivalent thereto including those explicitly, necessarily, or inherently disclosed herein. It should be noted that a description of numerical range (description of two values connected by "to") is interpreted to include the described values as the lower limit and the upper limit in some embodiments, and in other embodiments, the lower limit and/or the upper limit can be exclusive in the range.

[Multilayer Piezoelectric Element]

The multilayer piezoelectric element 100 pertaining to an aspect of the present invention (hereinafter also referred to simply as the "first aspect") has a structure in which internal electrodes 10 are placed between piezoelectric ceramic layers 40, as shown in the schematic cross-sectional view in FIG. 1. And, the internal electrodes 10 are formed by a metal whose silver content is 80 percent by mass or higher. It should be noted that, among the internal electrodes 10 shown in FIG. 1, those having the same letter ("a" or "b") represent electrodes of the same polarity. Also, the piezoelectric ceramic layers 40 are constituted by a piezoelectric ceramic whose primary component is an alkaline niobate having a perovskite structure and which further contains lithium manganate.

The internal electrodes 10 are formed by a metal whose silver content is 80 percent by mass or higher. By adjusting the silver content to 80 percent by mass or higher, the use quantity of platinum, palladium, and other expensive metals can be reduced to keep the manufacturing cost of the element low. Also, an increase in the percentage of silver offering excellent conductivity leads to a lower resistivity of the internal electrodes 10 and reduced electrical loss of the piezoelectric element in which they are used. Examples of metals whose silver content is 80 percent by mass or higher include silver-palladium alloy. The silver content in the internal electrodes 10 is preferably 85 percent by mass or higher, or more preferably 90 precent by mass or higher.

The silver content in the metal constituting the internal electrodes 10 can be confirmed by conducting an element analysis of the internal electrodes 10 using any of various measuring equipment, and then calculating the mass percentage of silver relative to all detected elements. Examples of measuring equipment that can be used include: an energy dispersive X-ray spectrometer (EDS) or wavelength dispersive X-ray spectrometer (WDS) installed on a scanning electron microscope (SEM) or transmission electron microscope (TEM); an electron probe micro-analyzer (EPMA); a laser ablation inductively coupled plasma mass spectrometer (LA-ICP-MS), and the like. The measured values may slightly vary depending on the type of device used for measurement, and in this disclosure, if a value satisfying the requirement set forth in this disclosure is obtained by properly using any of the listed devices or equivalent thereto, the value can be used as a representative value. Further, in this disclosure, when sampling a test sample for measurement or confirmation, such a test sample is prepared by randomly selecting an object or target (unless stated otherwise) so that the object or target can be used as a representative sample.

The piezoelectric ceramic layers 40, whose primary component is an alkaline niobate, further contain lithium manganate.

Figure 2:
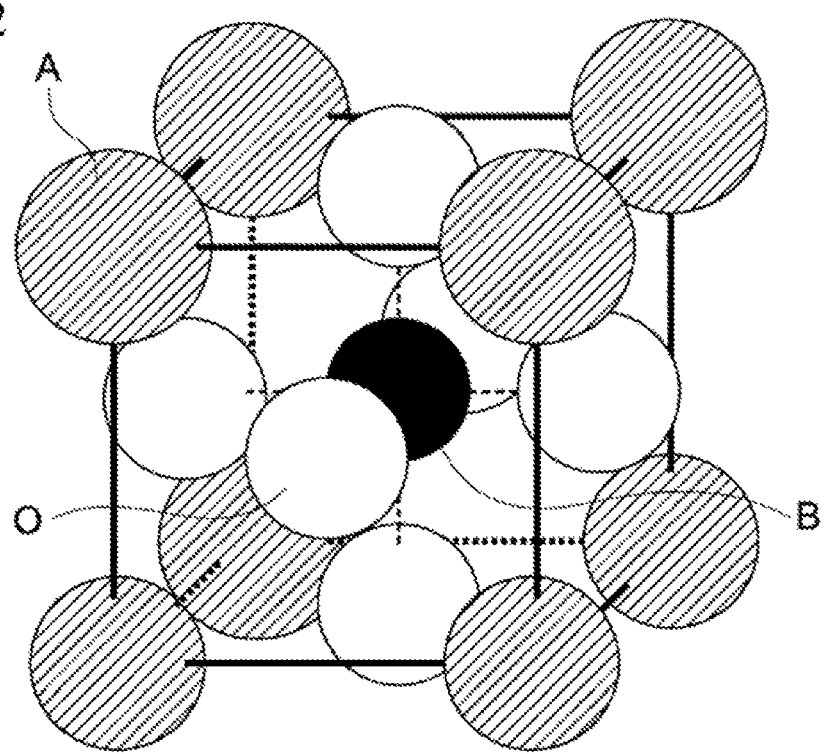
FIG. 2 is a perspective view showing a unit lattice model of perovskite structure.

The alkaline niobate, which is a primary component, is an oxide having a perovskite structure that contains, as its constituent elements, at least one type of alkali metal element selected from lithium, sodium, and potassium, as well as niobium. Here, the perovskite structure is a crystalline structure having A sites positioned at the apexes of a unit lattice, O sites positioned at the face centers of the unit lattice, and a B site positioned in the octahedron whose apexes correspond to the O sites, as shown in FIG. 2. In the alkaline niobate in this aspect, an alkali metal ion is positioned in the A site, a niobium ion is positioned in the B site, and an oxide ion is positioned in the O site, respectively. Additionally, various ions other than those mentioned above may be contained in the respective sites.

The piezoelectric ceramic layers 40 contain lithium manganate. This achieves high piezoelectricity and insulating property, allowing the piezoelectric element to have excellent properties. Lithium manganate takes forms expressed by various composition formulas, such as $LiZMnO_3$, $LiMn_2O_4$ and $LiMnO_2$; however, any of these compounds allows the aforementioned effects to manifest.

Here, the fact that lithium manganate is contained in the piezoelectric ceramic layers 40 is confirmed according to the procedure below. First, a laser ablation inductively coupled plasma mass spectrometer (LA-ICP-MS) is used to measure the contents of Li, Mn, and Nb, respectively, in a spot area recognized in a piezoelectric ceramic layer 40 from the difference in hue, brightness or saturation from the surroundings, and also in a part other than the spot area in the piezoelectric ceramic layer 40. Next, from the obtained measurement results, the ratio of Li quantity to Nb quantity (Li/Nb) indicated in atomic percentage, and the ratio of Mn quantity to Nb quantity (Mn/Nb) indicated in atomic percentage, are calculated for each measured location. Lastly, between the spot area and the part other than the spot area, the calculated Li/Nb values are compared against each other, while the Mn/Nb values are also compared against each other, and if both values are greater in the spot area, this spot area is determined to be lithium manganate.

From the viewpoint of achieving superior piezoelectricity and insulating property, preferably the contents of Li not constituting the aforementioned primary component and Mn, that are contained in the piezoelectric ceramic layers 40, are adjusted to 0.6 percent by mol or lower for Li and to 0.1 percent by mol or higher but no higher than 2.0 percent by mol for Mn (elemental basis), when the primary component represents 100 percent by mol, so as to ensure an appropriate content of lithium manganate. More preferably the contents of Li and Mn are adjusted to 0.5 percent by mol or lower for Li and to 0.3 percent by mol or higher but no higher than 1.5 percent by mol for Mn, (elemental basis), relative to 100 percent by mol of the primary component. If the content of Li is too high, the quantity of $Li_3NbO_4$ and other conductive compounds present between the sintered grains will increase and the insulating property of the piezoelectric ceramic layers 40 may drop. If the content of Mn is too high, on the other hand, Li in the primary component and Mn will react with each other to diminish Li in the primary component, which may cause the piezoelectricity and insulating property of the piezoelectric ceramic layers 40 to drop.

It should be noted that, while Li is also a constituent element of the primary component, the quantity of Li explained as a quantity relative to 100 percent by mol of the primary component does not include Li in the primary component. The quantity of Li contained in the piezoelectric ceramic layers 40 but not constituting the primary component, is calculated according to the method for determining the composition formula of alkaline niobate described later, as the remainder of the total quantity of Li obtained from the result of composition analysis, less the Li quantity that could form a solid solution in the alkaline niobate.

For the piezoelectric ceramic layers 40, preferably the diffraction intensity of lithium manganate obtained by the calculation method below based on an X-ray diffraction measurement using the CuKα line, or I, is in a range satisfying $4.5 \leq I \leq 12$.

[Calculation Method]

1) Calculate $I_{2\theta}$, which is a value of peak intensity $I_{0.2\theta}$ at each measurement point that has been standardized according to the calculation formula below, where the maximum value and minimum value of peak intensity in a 2θ range of 10 to 40° are given by $I_{0,max}$ and $I_{0,min}$, respectively:

$$I_{2\theta} = (I_{0.2\theta} - I_{0,min})/(I_{0,max} - I_{0,min}) \times 1000$$

2) Obtain the difference between the maximum value $I_{2\theta,max}$ and minimum value $I_{2\theta,min}$ of the $I_{2\theta}$ in a 2θ range of 18 to 19°, or $(I_{2\theta,max} - I_{2\theta,min})$, as the diffraction intensity of lithium manganate I.

The value of I above corresponds to the main-peak diffraction intensity of lithium manganate in various forms, such as $LiZMnO_3$ having a layered rock-salt structure and $LiMn_2O_4$ having a spinel structure, which means that the greater this value, the higher the content of lithium manganate becomes. Piezoelectric ceramic layers 40 offering excellent insulating property can be obtained when the value of I above is 4.5 or greater. In this respect, more preferably the value of I above is adjusted to 5 or greater. On the other hand, piezoelectric ceramic layers 40 offering excellent piezoelectricity can be obtained when the value of I above is no greater than 12. In this respect, more preferably the value of I above is adjusted to no greater than 10.

As a rule, the aforementioned X-ray diffraction measurement is performed on a piezoelectric ceramic layer 40, or specifically a part sandwiched between internal electrodes 10 or between an internal electrode 10 and an external electrode, in the multilayer piezoelectric element 100. If, however, removing the external electrode for the purpose of measurement is difficult or removing the effect of the diffraction line from the internal electrode 10 is difficult because the piezoelectric ceramic layer 40 is thin, then the measurement may be performed on a powder sample obtained by pulverizing the piezoelectric ceramic layer 40 together with the electrodes. In this case, the diffraction intensity I of lithium manganate is calculated according to the aforementioned method after eliminating, from the measured results, those peaks derived from the metals constituting the electrodes. Additionally, if the protective parts formed by the side margin parts 20 and/or cover parts 30, as described below, are confirmed to have the same composition as the piezoelectric ceramic layers 40, then the results of X-ray diffraction measurement performed on the protective parts may be used as the measured results for the piezoelectric ceramic layers 40.

The piezoelectric ceramic layers 40 may further contain at least one type of alkaline earth metal selected from calcium, strontium, and barium. This makes the piezoelectric ceramic layers 40 dense, comprising sintered grains of small sizes, so that they will manifest excellent piezoelectricity. In this respect, the total content of the alkaline earth metal is preferably in excess of 0.2 percent by mol, or more preferably 0.3 percent by mol or higher, or yet more preferably 0.5 percent by mol or higher, when the content of elements (oftentimes in ion state in reality) in the B sites in the alkaline niobate, which is a primary component, represents 100 percent by mol. On the other hand, from the viewpoint of further improving the electrical insulating property of the piezoelectric ceramic layers 40 to make the piezoelectric element usable under a high electric field and also prolong its lifespan, the aforementioned total content is preferably 5.0 percent by mol or lower, or more preferably 3.0 percent by mol or lower, or yet more preferably 1.0 percent by mol or lower.

The content of element in the B sites in the alkaline niobate, and the content of the alkaline earth metal, are both determined from the measured results of element ratios according to the confirmation method of composition formula described below.

The alkaline niobate, which is a primary component of the piezoelectric ceramic layers 40, is preferably one expressed by Composition Formula (1) below from the viewpoint of allowing excellent piezoelectric characteristics to manifest, and also from the viewpoint of obtaining a piezoelectric element that will have a long lifespan when used under a high electric field:

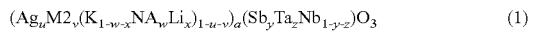
$(Ag_uM2_v(K_{1-w-x}NA_wLi_x)_{1-u-v})_a(Sb_yTa_zNb_{1-y-z})O_3$ (1)

It should be noted that, in the formula, M2 represents at least one type of alkaline earth metal selected from calcium, strontium, and barium. Also, u, v, w, x, y, z, and a represent values satisfying the inequalities expressed by $0.005<u\leq0.05$, $0.002<v\leq0.05$, $0.007<u+v\leq0.1$, $0\leq w\leq 1$, $0.02<x\leq 0.1$, $0.02<w+x\leq 1$, $0\leq y\leq 0.1$, $0\leq z\leq 0.4$, and $1<a\leq 1.1$, respectively.

Here, the fact that the piezoelectric ceramic layers 40 are constituted by an alkaline niobate expressed by the aforementioned composition formula, as a primary component, is confirmed by employing an X-ray diffractometer (XRD) that uses the Cu-Kα line to measure diffraction line profiles on a piezoelectric ceramic layer 40 exposed on the surface of the multilayer piezoelectric element 100, or a powder obtained by pulverizing the multilayer piezoelectric element 100, and then confirming that the percentage of the maximum diffraction line intensity in any diffraction profile derived from other structure(s), relative to the maximum diffraction line intensity in the profile derived from the perovskite structure, is 10 percent or lower, followed by a measurement of the ratio of each element contained in the piezoelectric ceramic layers 40 using a high-frequency inductively coupled plasma (ICP) emission spectrometer, ion chromatographic apparatus, or X-ray fluorescence (XRF) spectrometer, and then by a confirmation that the measured result matches the corresponding ratio in the composition formula. It should be noted that, when XRD measurement is performed on a piezoelectric ceramic layer 40 exposed on the surface of the multilayer piezoelectric element 100, the method of exposure is not limited in any way and a method whereby the piezoelectric element is cut or ground may be adopted, for example. Also, when XRD measurement is performed on a powder obtained by pulverizing the multilayer piezoelectric element 100, the means for pulverization is not limited in any way, either, and a hand mill (mortar and pestle), etc., may be utilized. Furthermore, when XRD measurement is performed on a powder obtained by pulverizing the multilayer piezoelectric element 100, peaks attributable to the metal constituting the internal electrodes 10 will also be detected and must therefore be removed prior to the aforementioned confirmation.

The piezoelectric ceramic layers 40 may contain 0.1 percent by mol or more but no more than 3.0 percent by mol of Si, relative to 100 percent by mol of the primary component mentioned above. This can make the piezoelectric ceramic layers 40 denser. Also, Si reacts with the excess Li that could not react with Mn, to generate $Li_2SiO_3$, $Li_4SiO_4$, and other compounds having high electrical insulating property, to inhibit generation of conductive compounds such as $Li_3NbO_4$ and thus contribute to the inhibition of drop in the electrical resistivity of the piezoelectric ceramic layers 40. From the viewpoint of enhancing this action, the ratio by mol of Si to Li other than that which is a constituent element of the alkaline niobate (Si/Li) is preferably 1.0 or higher, or more preferably 1.5 or higher, or yet more preferably 2.0 or higher.

The content of Si, from the viewpoint of allowing the aforementioned action to be demonstrated fully, is preferably 0.5 percent by mol or higher, or more preferably 1.0 percent by mol or higher, relative to 100 percent by mol of the primary component. On the other hand, a Si content of no higher than 3.0 percent by mol relative to 100 percent by mol of the primary component keeps the generating quantities of heterogeneous phases having no piezoelectricity low, and the piezoelectric ceramic will have excellent piezoelectric characteristics. In this respect, the content of Si is preferably no higher than 2.5 percent by mol, or more preferably no higher than 2.0 percent by mol, relative to 100 percent by mol of the primary component.

The piezoelectric ceramic layers 40 may contain, as necessary, at least one type of first-row transition element selected from Sc, Ti, V, Cr, Fe, Co, Ni, Cu, and Zn. Containing these elements in appropriate quantities allows for adjustment of the firing temperature, control of grain growth in, and extension of lifespan under a high electric field of, the multilayer piezoelectric element 100.

Also, the piezoelectric ceramic layers 40 may contain, as necessary, at least one type of second-row transition element selected from Y, Mo, Ru, Rh, and Pd. Containing these elements in appropriate quantities allows for adjustment of the firing temperature, control of grain growth in, and extension of the lifespan under a high electric field of, the multilayer piezoelectric element 100.

Furthermore, the piezoelectric ceramic layers 40 may contain, as necessary, at least one type of third-row transition element selected from La, Ce, Pr, Nd, Sm, Eu, Gd, Tb, Dy, Ho, Er, Tm, Yb, Lu, Hf, W, Re, Os, Ir, Pt, and Au. Containing these elements in appropriate quantities allows for adjustment of the firing temperature, control of grain growth in, and extension of the lifespan under a high electric field of, the multilayer piezoelectric element 100.

Needless to say, in the first aspect, multiple types of first-row, second-row, and third-row transition elements among those mentioned above may also be contained in the piezoelectric ceramic layers 40.

In the first aspect, side margin parts 20 may be formed between both side faces in the Y-axis direction and the internal electrodes 10, and cover parts 30 may be formed on the top and bottom faces in the Z-axis direction, respectively, as shown in FIG. 1. The side margin parts 20 and cover parts 30 function as protective parts that protect the piezoelectric ceramic layers 40 and internal electrodes 10.

From the viewpoint of adjusting the shrinkage factor of the multilayer piezoelectric element 100 during firing as well as mitigating the internal stress of the multilayer piezoelectric element 100, preferably the side margin parts 20 and cover parts 30 are formed by a sintered body whose primary component is an alkaline niobate, just like the piezoelectric ceramic layers 40. In this respect, more preferably the side margin parts 20 and cover parts 30 contain lithium manganate (e.g. $LiMn_2O_4$), just like the piezoelectric ceramic layers 40. However, the material for forming the side margin parts 20 and cover parts 30 need not be one whose primary component is an alkaline niobate, so long as it has high insulating property.

In the first aspect, first and second external electrodes (not illustrated) may be provided further on the surface of the multilayer piezoelectric element 100. In this case, the internal electrodes 10 are alternately connected to a different external electrode. According to this constitution, efficient interconversion of the electrical energy between the first and second external electrodes, and the mechanical energy in the stacking direction of the piezoelectric ceramic layers 40 placed between the internal electrodes 10, becomes possible.

The material for constituting the external electrodes is not limited in any way so long as it is highly conductive and physically and chemically stable under the polarization conditions and in the use environment of the piezoelectric element. Examples of electrode materials that can be used include, for example, silver (Ag), copper (Cu), gold (Au), platinum (Pt), palladium (Pd), nickel (Ni), and alloys thereof.

[Method for Manufacturing Multilayer Piezoelectric Element]

The method for manufacturing a multilayer piezoelectric element pertaining to another aspect of the present invention (hereinafter also referred to simply as the "second aspect") includes: preparing green sheets that contain a powder of an alkaline niobate having a perovskite structure, at least one type of manganese compound selected from manganese oxide, manganese carbonate, and manganese acetate, and an organic binder; placing, on the green sheets, precursors to internal electrodes that contain a metal whose silver content is 80 percent by mass or higher; stacking the green sheets on which the precursors to internal electrodes have been placed, to produce a laminate body; and firing the laminate body to obtain a fired body constituted by internal electrodes provided between sintered body layers whose primary component is the alkaline niobate and which further contains lithium manganate.

The powder of an alkaline niobate having a perovskite structure is obtained, for example, by mixing at a desired ratio and then firing (calcining) a powder of a compound containing at least one type of alkali metal selected from lithium, sodium, and potassium, and a powder of a compound containing niobium. So that the piezoelectric ceramic to be obtained as a final product will have desired properties, a compound containing elements other than alkali metals and niobium may be added. Also, a commercial alkaline niobate powder, if available, may be used directly.

Examples of compounds that may be used as the material for the alkaline niobate include lithium carbonate ($Li_2CO_3$) being a lithium compound, sodium carbonate ($Na_2CO_3$) and sodium hydrogen carbonate ($NaHCO_3$) being sodium compounds, potassium carbonate ($K_2CO_3$) and potassium hydrogen carbonate ($KHCO_3$) being potassium compounds, and niobium pentoxide ($Nb_2O_5$) being a niobium compound. Also, tantalum pentoxide ($Ta_2O_5$) which is a tantalum compound, and antimony trioxide ($Sb_2O_3$) which is an antimony compound, are among the compounds that are frequently used, but optional, components.

Preferably the compounding ratio of each of the aforementioned compounds is adjusted so that the sintered body of alkaline niobate to be obtained by firing will be expressed by Composition Formula (1) below:

$$(Ag_uM2_v(K_{1-w-x}Na_wLi_x)_{1-u-v})_a(Sb_yTa_zNb_{1-y-z})O_3 \qquad (1)$$

It should be noted that, in the formula, M2 represents at least one type of alkaline earth metal selected from calcium, strontium, and barium. Also, u, v, w, x, y, z, and a represent values satisfying the inequalities expressed by $0.005 < u \le 0.05$, $0.002 < v \le 0.05$, $0.007 < u+v \le 0.1$, $0 \le w \le 1$, $0.02 < x \le 0.1$, $0.02 < w+x \le 1$, $0 \le y \le 0.1$, $0 < z \le 0.4$, and $1 < a \le 1.1$, respectively.

Having prepared at these compounding ratios, the piezoelectric ceramic, when fired integrally with the internal electrodes formed by a metal whose silver content is 80 percent by mass or higher, can provide a piezoelectric element that offers superior piezoelectric characteristics as well as a longer lifespan even when used under a high electric field.

The method for mixing the aforementioned compound powders is not limited in any way so long as the powders are mixed uniformly in a manner inhibiting impurities from mixing in, and either dry mixing or wet mixing may be adopted. If wet mixing using a ball mill is adopted as the mixing method, partially stabilized zirconia (PSZ) balls should be used in a ball mill, with ethanol or other organic solvent employed as a dispersion medium, for example, to perform around 8 to 60 hours of agitation, followed by drying to volatilize the organic solvent.

The calcination conditions for the obtained mixed powder are not limited in any way so long as a desired alkaline niobate can be obtained through reaction of the aforementioned compounds. One example is to perform firing in atmosphere at a temperature of 700 to 1000° C. for 1 to 10 hours. The calcined powder may be used directly in the manufacturing of green sheets, but preferably it is disintegrated using a ball mill, stamp mill, etc., in that doing so will enhance the mixability of the powder with the lithium compound, manganese compound, and organic binder described below.

In the second aspect, at least one type of manganese compound selected from manganese oxide, manganese carbonate, manganese acetate, and lithium manganate is added to the aforementioned powder of an alkaline niobate having a perovskite structure. This manganese compound reacts with lithium in the alkaline niobate during the firing of the laminate body as described below, to generate lithium manganate and thus allow for generation, even at a low firing temperature, of dense sintered body layers having high insulating property. It should be noted that lithium manganate is available in forms expressed by various composition formulas such as $Li_2MnO_3$, $LiMn_2O_4$, and $LiMnO_2$, which means that adding any lithium manganate as the aforementioned manganese compound will cause it to react with lithium to generate lithium manganate in different compositions.

In the second aspect, a lithium compound may be added, in addition to the manganese compound, to the aforementioned alkaline niobate powder. This increases the quantity of lithium manganate to be generated during firing, which allows for generation of denser sintered body layers having high insulating property. Examples of lithium compounds that may be used include lithium carbonate and lithium fluoride, for example.

The additive quantities of the lithium compound and manganese compound should be determined as deemed appropriate according to the required firing temperature and piezoelectric element properties. One example is to adopt quantities that provide 0.6 percent by mol or less of Li in terms of the element, and 0.1 percent by mol or more but no more than 2.0 percent by mol of Mn in terms of the element, when the aforementioned alkaline niobate powder represents 100 percent by mol. From the viewpoint of balancing the sintering property, piezoelectricity, and insulating property, the content of Li and Mn are preferably 0.5 percent by mol or lower for Li, and 0.3 percent by mol or higher but no higher than 1.5 percent by mol for Mn, in terms of the elements, relative to 100 percent by mol of the alkaline niobate.

In the second aspect, an organic binder is added to the aforementioned powder of an alkaline niobate having a perovskite structure and the aforementioned lithium compound and manganese compound. This organic binder is not limited in type so long as it can form the mixture of the aforementioned components into a desired shape and retain that shape, while volatilizing without leaving carbon, etc., behind through the firing or binder removal treatment preceding thereto. Examples of organic binders that can be used include those based on polyvinyl alcohol, polyvinyl butyral, cellulose, urethane, and vinyl acetate.

The use quantity of the organic binder is not limited in any way, either, but since it will be removed in a subsequent process, preferably its quantity is minimized to the extent that desired formability/shape retentivity can be achieved in that doing so reduces the material cost.

The method for mixing the aforementioned components is not limited in any way so long as the components are mixed uniformly in a manner inhibiting impurities from mixing in. One example is ball mill mixing.

When mixing the aforementioned components, various additives may be mixed in such as a plasticizer to improve the formability of the mixture into green sheets afterward and a dispersant to disperse the powder uniformly.

In the second aspect, a compound of at least one type of alkaline earth metal selected from calcium, strontium, and barium may be added to the aforementioned powder of an alkaline niobate having a perovskite structure. This alkaline earth metal compound, through an interaction with the silver that diffuses from the internal electrodes during firing as described below, will retain the sizes and size variation of sintered grains in the generated sintered body small and make it dense, thereby contributing to the manifestation of excellent piezoelectric characteristics. From the viewpoint of enhancing this action, the additive quantity of the alkaline earth metal compound is such that the total content of alkaline earth metal becomes preferably over 0.2 percent by mol, or more preferably 0.3 percent by mol or higher, or yet more preferably 0.5 percent by mol or higher, when the aforementioned alkaline niobate powder represents 100 percent by mol. From the viewpoint of obtaining piezoelectric ceramic layers having high electrical insulating property, on the other hand, the additive quantity of the alkaline earth metal compound is such that the total content of alkaline earth metal becomes preferably 5.0 percent by mol or lower, or more preferably 3.0 percent by mol or lower, or yet more preferably 1.0 percent by mol or lower, when the aforementioned alkaline niobate powder represents 100 percent by mol. Furthermore, if a compound of an alkaline earth metal is added, preferably the alkaline earth metal is caused to form a solid solution, at least partially, in the A sites of the alkaline niobate having a perovskite structure, by adjusting the composition of the alkaline niobate or its firing conditions.

The alkaline earth metal compound to be used is not limited in any way so long as it is a compound containing calcium, strontium, or barium. It may contain more than one of these elements, or it may contain other elements to the extent that a desired piezoelectric ceramic will be obtained. Examples of alkaline earth metal compounds include calcium carbonate ($CaCO_3$), calcium metasilicate ($CaSiO_3$), and calcium orthosilicate ($CazSiO_4$) that contain calcium, strontium carbonate ($SrCO_3$) that contains strontium, and barium carbonate ($BaCO_3$) that contains barium.

Also, in addition to Si explained in the first aspect, additive elements that are used for improving the various properties of piezoelectric ceramics, as well as compounds or compositions that function as sintering auxiliaries, may be mixed in. When additive elements are to be mixed in, examples of compounds that may be used include, for example, silicon dioxide ($SiO_2$), calcium metasilicate ($CaSiO_3$), and calcium orthosilicate ($Ca_2SiO_4$) that are sources of Si.

Among additive elements, Si is useful because it can inhibit the alkali metals from volatilizing or precipitating between the sintered grains by reacting, when fired, with the elements contained in the alkaline niobate or elements that have been added separately, and thus causing $Li_2SiO_3$, $Li_4SiO_4$, $K_3Nb_3O_6Si_2O_7$, $KNbSi_2O_7$, $K_3LiSiO_4$, $KLi_3SiO_4$ and other crystalline phases, or non-crystalline phases containing the foregoing elements, to precipitate.

Additionally, Si manifests its function as a sintering auxiliary and also presents the action of lowering the firing temperature. In this case, preferably the additive quantity of Si is adjusted to the ranges explained in the first aspect.

Regarding the method for forming green sheets from a mixture of the aforementioned components, the doctor blade method, extrusion molding method, or any other commonly used method may be adopted.

In the second aspect, precursors to internal electrodes containing a metal whose silver content is 80 percent by mass or higher are placed on the green sheets obtained per the aforementioned procedure. The precursors to internal electrodes can be placed using any commonly used method, but a method of printing or applying into the shapes of internal electrodes a paste that contains a metal powder whose silver content is 80 percent by mass or higher, is preferred in terms of cost. When placing the precursors to internal electrodes by means of printing or application, glass frit, or a powder having a composition similar to that of the alkaline niobate powder contained in the green sheets, may be contained in the paste to improve its strength of adhesion to the sintered body layers after firing.

When placing the precursors to internal electrodes on the green sheets, they may be placed in a manner keeping spaces that will become side margin parts in the resulting multilayer piezoelectric element.

In the second aspect, the aforementioned green sheets on which the precursors to internal electrodes have been placed are stacked, after which the green sheets are bonded together to produce a laminate body.

The stacking and bonding can be performed using any commonly used method, but a method of thermocompression-bonding the green sheets together using the action of a binder is preferred in terms of cost.

At the time of stacking and compression-bonding, green sheets that will become cover parts in the resulting multilayer piezoelectric element may be added at both end parts in the stacking direction. In this case, the green sheets to be added may have a composition identical to, or different from, the composition of the aforementioned green sheets on which the precursors to internal electrodes have been placed. From the viewpoint of aligning the shrinkage factors during firing, preferably the composition of the green sheets to be added is identical or similar to the composition of the aforementioned green sheets on which the precursors to internal electrodes have been placed.

In the second aspect, the laminate body obtained per the aforementioned procedure is fired. Prior to the firing, the organic binder may be removed from the laminate body. In this case, the removal of the organic binder, and the firing, may be performed in succession using the same firing apparatus. The conditions for removing the organic binder, and for firing, should be set as deemed appropriate by considering the volatilization temperature and content of the binder, sintering property of the piezoelectric ceramic composition, durability of the internal electrode material, and so on. Examples of conditions for removing the organic binder include 5 to 20 hours in atmosphere at a temperature of 300 to 500° C. Examples of firing conditions to be maintained include 1 to 5 hours in atmosphere at a temperature of 800 to 1100° C. If multiple sintered body for multilayer piezoelectric elements are to be obtained from a single green body, the green body may be split into several blocks prior to the firing.

In the second aspect, through the aforementioned firing, internal electrodes are generated from the precursors to internal electrodes at the same time as sintered body layers whose primary component is an alkaline niobate are generated from the aforementioned green sheets, to obtain a fired body having the internal electrodes between the sintered body layers whose primary component is an alkaline niobate. It is considered that, as this happens, lithium manganate precipitates in the sintered body layers. As a result, piezoelectric ceramic layers demonstrating high piezoelectricity and insulating property will be achieved in the resulting multilayer piezoelectric element, allowing the piezoelectric element to have excellent properties.

Additionally, although Ag diffuses from the internal electrodes to the sintered body layers during firing, this Ag will, if the green sheets and sintered body layers contain at least one type of alkaline earth metal selected from calcium, strontium, and barium, interact with the alkaline earth metal to make the sintered body layers dense, being formed by fine sintered grains.

In the second aspect, the fired body obtained by firing is polarization-treated to become a multilayer piezoelectric element. The polarization treatment is typically performed by forming a pair of electrodes on the surface of the fired body using a conductive material, and then impressing high voltage between the electrodes.

For the forming of electrodes, a method of applying or printing and then baking a paste containing an electrode material onto the surface of the sintered body, a method of vapor-depositing an electrode material on the surface of the sintered body, or any other commonly used method, may be adopted. For the electrode material, silver (Ag), copper (Cu), gold (Au), platinum (Pt), palladium (Pd), nickel (Ni), and alloys thereof, which were cited as materials for constituting the external electrodes in the first aspect, may be used.

The conditions for polarization treatment are not limited in any way so long as the orientation of spontaneous polarization can be aligned in each sintered body layer without causing the fired body to suffer cracks and other damage. One example is to impress an electric field of 4 to 6 kV/mm at a temperature of 100 to 150° C.

EXAMPLES

The present invention is explained more specifically below using examples; however, it should be noted that the present invention is not limited to these examples.

Example 1

[Manufacturing of Multilayer Piezoelectric Element]

As a powder of an alkaline niobate having a perovskite structure, a calcined powder expressed by the composition formula $Li_{0.06}Na_{0.52}K_{0.42}NbO_3$ was prepared. To this calcined powder representing 100 percent by mol, 0.1 percent by mol of $Li_2CO_3$, 1.3 percent by mol of $SiO_2$, 0.5 percent by mol of $BaCO_3$, 0.5 percent by mol of $MnCO_3$, and a polyvinyl butyral-based organic binder, were added, respectively, and all were mixed in a wet ball mill. The obtained mixed slurry was formed, using a doctor blade, into green sheets of 13 μm in thickness. On these green sheets, an Ag—Pd alloy paste (Ag/Pd ratio by mass=9/1) was screen-printed to form electrode patterns, after which 26 layers of these green sheets were stacked and then compression-bonded under heating with a pressure of approx. 50 MPa, to obtain a laminate body. This laminate body was cut to individual pieces, which were then treated in atmosphere to remove the binder, followed by firing at 980° C. for 2 hours in the atmosphere, to obtain fired bodies. On the surface of one of these fired bodies, a conductive paste containing Ag was applied in a manner contacting the alternately exposed layers of internal electrodes on the surface, and then baked by raising the temperature to 600° C., to form a pair of external electrodes. Finally, an electric field of 3.0 kV/mm was impressed for 3 minutes between the pair of external electrodes in a thermostatic chamber controlled at 100° C. for polarization treatment, to obtain the multilayer piezoelectric element pertaining to Example 1.

[Confirmation of Presence of Lithium Manganate in Piezoelectric Ceramic Layer and Calculation of Its Diffraction Intensity]

X-ray diffraction measurement based on the CuKα line was performed on a piezoelectric ceramic layer in the obtained multilayer piezoelectric element using an X-ray diffractometer (RINT2500 Series, manufactured by Rigaku Corporation). The result of measurement was that, in addition to the peaks derived from the perovskite structure, a peak positioned in a 2θ range of 18 to 19° that should not appear from this structure was confirmed. Since this peak position corresponds to the main peak positions of various types of lithium manganate such as $Li_2MnO_3$ having a bedded rock-salt structure and $LiMn_2O_4$ having a spinel structure, it can be argued that the multilayer piezoelectric element pertaining to Example 1 contains lithium manganate, represented by these compounds, in its piezoelectric ceramic layers.

When the diffraction intensity I of lithium manganate such as $LiMn_2O_4$ was calculated according to the aforementioned method based on the obtained X-ray diffraction measurement results, I was 4.52.

[Confirmation of Li and Mn Distributions in Piezoelectric Ceramic Layer]

When a side margin part of the obtained multilayer piezoelectric element was observed using an optical microscope, presence of orange and black spots was confirmed in a white mother phase (the color of manganese varies depending on the valence, and manganese is contained in both the orange and black spots). The mother phase area and spot areas were measured for contents of Li, Nb, and Mn using a laser ablation inductively coupled plasma mass spectrometer (LA-ICP-MS), and the content of each element was calculated with respect to the content of Nb representing 100 atomic percentage. The results are shown in Table 1.

TABLE 1

| Analyzed location | Contained elements and percentages (% by atom)* | | |
|---|---|---|---|
| | Li | Nb | Mn |
| No change in color | 4.7 | 100 | 0.12 |
| Location where the color had | 6.5 | 100 | 0.69 |
| changed to orange | 14 | 100 | 0.8 |
| Location where the color had | 13 | 100 | 2.2 |
| changed to black | 9.3 | 100 | 1.1 |

*Value relative to Nb representing 100 atomic percentage

These results show higher content ratios of Li and Mn in the parts corresponding to orange and black spots compared to the mother phase area. When these results, and the aforementioned X-ray diffraction measurement results, are considered in combination with the fact that the piezoelectric ceramic layers and side margin parts have the same composition in the multilayer piezoelectric element pertaining to Example 1, it can be argued that, in the multilayer piezoelectric element pertaining to Example 1, a Li- and Mn-rich compound containing lithium manganate had generated in a spotty manner in the piezoelectric ceramic layers.

[Measurement of Electrical Resistivity of Multilayer Piezoelectric Element]

The obtained multilayer piezoelectric element was impressed with an electric field of 6 kV/mm for 5 minutes at room temperature and measured for voltage value and current value. Then, based on the obtained measured values and the element dimensions, the electrical resistivity of the multilayer piezoelectric element pertaining to Example 1 was calculated. The obtained electrical resistivity was $8.7 \times 10^{12}$ Ω·cm.

[Evaluation of Piezoelectric Characteristics]

The obtained multilayer piezoelectric element was evaluated for piezoelectric characteristics based on displacement performance $d^*_{33}$ (pm/V). First, unipolar sinusoidal waves that achieve the maximum electric field of 8 kV/mm were applied to the multilayer piezoelectric ceramic at approx. 100 Hz, and the resulting displacement of the multilayer piezoelectric element was measured using a laser doppler displacement gauge. Then, the obtained displacement of the multilayer piezoelectric element was divided by the maximum voltage calculated from the thickness of the piezoelectric ceramic layer (distance between the electrodes) and the maximum electric field, and also by the number of piezoelectric ceramic layers constituting the multilayer piezoelectric element, to calculate the displacement performance $d^*_{33}$ per unit voltage in one piezoelectric ceramic layer. The obtained $d^*_{33}$ was 225 pm/V.

Examples 2 to 4

[Manufacturing of Multilayer Piezoelectric Element]

The multilayer piezoelectric element pertaining to Example 2 was manufactured in the same manner as in Example 1, except that the quantity of $MnCO_3$ to be added to the calcined powder of alkaline niobate was changed to 0.2 percent by mol relative to 100 percent by mol of the calcined powder and that the firing temperature of the laminate body was changed to 1020° C. Also, the multilayer piezoelectric element pertaining to Example 3 was manufactured in the same manner as in Example 1, except that the quantity of $MnCO_3$ to be added to the calcined powder of alkaline niobate was changed to 1.0 percent by mol relative to 100 percent by mol of the calcined powder and that the firing temperature of the laminate body was changed to 950° C. Furthermore, the multilayer piezoelectric element pertaining to Example 4 was manufactured in the same manner as in Example 2, except that the quantity of $MnCO_3$ to be added to the calcined powder of alkaline niobate was changed to 2.0 percent by mol relative to 100 percent by mol of the calcined powder.

[Confirmation of Presence of Lithium Manganate in Piezoelectric Ceramic Layer and Calculation of Its Diffraction Intensity]

When X-ray diffraction measurement was performed on a piezoelectric ceramic layer in each of the obtained multilayer piezoelectric elements according to the same method in Example 1, a peak positioned in a 2θ range of 18 to 19° was confirmed, in addition to the peaks derived from the perovskite structure, in all of the elements. When the diffraction intensity I of lithium manganate was calculated based on the measured results, I was 4.11 in Example 2, 6.14 in Example 3, and 12.34 in Example 4.

[Measurement of Electrical Resistivity of Multilayer Piezoelectric Element]

When the obtained multilayer piezoelectric elements were measured for electrical resistivity according to the same method in Example 1, the result was $7.2 \times 10^8$ Ω·cm in Example 2, $1.6 \times 10^{13}$ Ω·cm in Example 3, and $3.2 \times 10^9$ Ω·cm in Example 4.

[Evaluation of Piezoelectric Characteristics]

When the obtained multilayer piezoelectric elements were measured for $d^*_{33}$ according to the same method in Example 1, the result was 220 pm/V in Example 2, 227 pm/V in Example 3, and 190 pm/V in Example 4.

Comparative Example

[Manufacturing of Multilayer Piezoelectric Element]

The multilayer piezoelectric element according to the Comparative Example was manufactured in the same manner as in Example 2, except that MnCO$_3$ was not added to the calcined powder of alkaline niobate.

[Confirmation of Presence of Lithium Manganate in Piezoelectric Ceramic Layer and Calculation of Its Diffraction Intensity]

When X-ray diffraction measurement was performed on a piezoelectric ceramic layer in the obtained multilayer piezoelectric element according to the same method in Example 1, only the peaks derived from the perovskite structure were confirmed and no particular peak was confirmed that was positioned in a 2θ range of 18 to 19°.

[Measurement of Electrical Resistivity of Multilayer Piezoelectric Element]

When the obtained multilayer piezoelectric element was measured for electrical resistivity according to the same method in Example 1, the result was 5.0×10$^6$ Ω·cm.

[Evaluation of Piezoelectric Characteristics]

When the obtained multilayer piezoelectric element was measured for d*$_{33}$ according to the same method in Example 1, the result was 203 pm/V.

The results of Examples 1 to 4 and Comparative Example explained above are organized by the number of added moles of Mn and shown in Table 2.

TABLE 2

|  | Comparative Example | Example 2 | Example 1 | Example 3 | Example 4 |
|---|---|---|---|---|---|
| Number of added moles of Mn relative to 100 mol of calcined powder | 0 | 0.2 | 0.5 | 1.0 | 2.0 |
| Firing temperature (° C.) | 1020 | 1020 | 980 | 950 | 1020 |
| Precipitation of lithium manganate | No | Yes | Yes | Yes | Yes |
| I | 3.72 | 4.11 | 4.52 | 6.14 | 12.34 |
| Resistivity (Ω·cm) | 5.0 × 10$^6$ | 7.2 × 10$^8$ | 8.7 × 10$^{12}$ | 1.6 × 10$^{13}$ | 3.2 × 10$^9$ |
| d*$_{33}$(pm/V) | 203 | 220 | 225 | 227 | 190 |

From the obtained results, it is presumed that, in an aspect of the present invention, adding Li and Mn compounds to the green sheets would generate lithium manganate during firing to improve the sintering property, so that dense piezoelectric ceramic layers would be achieved even when firing is performed at low temperature. It is understood that, as a result of this, a multilayer piezoelectric element having high electrical resistivity and high electrical reliability would be obtained.

The following should be noted:

1) As discussed above, in the Comparative Example, MnCO$_3$ was not added to the calcined powder of alkaline niobate, and no peak positioned in a 2θ range of 18 to 19° was confirmed, in addition to the peaks derived from the perovskite structure. However, the addition of MnCO$_3$ does not naturally or inherently result in formation of lithium manganate in a resultant piezoelectric ceramic layer, since formation of lithium manganate depends not only on the compositions of the starting materials but also on the sintering conditions (such as sintering temperature and duration) and the compositions of the internal electrode layers as well as the quantity of elements dispersed from the internal electrode layers during the sintering. A skilled artisan in the art can readily provide such conditions and/or compositions, in view of the present disclosure, as a matter of routine experimentation.

2) As discussed above, in the Comparative Example, although no peak positioned in a 2θ range of 18 to 19° was confirmed, in addition to the peaks derived from the perovskite structure, the diffraction intensity I of lithium manganate was calculated at 3.72. This is because although there was no particular peak, the diffraction chart showed numerous background fluctuations, and by using such background fluctuations, the value of I could be calculated. However, unless formation of lithium manganate occurs, the value of I would not be 4.5 or higher.

3) Further, as discussed above, although a lithium manganate (initial lithium manganate) can be used as a manganese compound in the starting material, a lithium manganate (resultant lithium manganate) contained in a resultant piezoelectric ceramic layer is different from the initial lithium manganate and has a different composition formula from that of the initial lithium manganate, since lithium manganates can be in various forms such as Li$_2$MnO$_3$, LiMn$_2$O$_4$, and LiMnO$_2$, and any initial lithium manganate will react further with lithium and generate a lithium manganate having a different composition.

INDUSTRIAL APPLICABILITY

According to the present invention, a multilayer piezoelectric element using an alkaline niobate-based piezoelectric ceramic can be provided in a manner inhibiting its reliability from dropping, and also at low cost. Such multilayer piezoelectric element contains no lead as a constituent component and thus can reduce environmental burdens throughout its lifecycle, which is useful. Additionally, the multilayer piezoelectric element has a high content percentage of silver in the internal electrodes and thus is low in electrical resistivity and can reduce electrical loss during use, which is also useful.

We claim:

1. A multilayer piezoelectric element comprising:
    piezoelectric ceramic layers constituted by a piezoelectric ceramic whose primary component is an alkaline niobate having a perovskite structure and which further contains lithium manganate; and
    internal electrodes formed by a metal whose silver content is 80 percent by mass or higher, and provided between the piezoelectric ceramic layers.

2. The multilayer piezoelectric element according to claim 1, wherein content of Li not constituting the primary component and Mn contained in the piezoelectric ceramic layers are more than 0 percent by mol but 0.6 percent by mol or lower for Li, and 0.1 percent by mol or higher but no higher than 2.0 percent by mol for Mn (elemental basis), when the primary component represents 100 percent by mol.

3. The multilayer piezoelectric element according to claim 1, wherein the piezoelectric ceramic layers satisfy "4.5≤I≤12" when a diffraction intensity of lithium manganate obtained by a calculation method below based on X-ray diffraction measurement using a CuKα line is given by I:

[Calculation Method]

1) Calculate I$_{2θ}$, which is a standardized or relativized value of peak intensity I$_{0,2θ}$ at each measurement point corresponding to a peak and which is determined according to a calculation formula below, where a maximum value of peak intensity and a minimum value of peak intensity in a 2θ range of 10° to 40° are given by I$_{0,max}$ and I$_{0,min}$, respectively:

$I_{2θ}=(I_{0,2θ}-I_{0,min})/(I_{0,max}-I_{0,min})×1000$

2) Obtain a difference between a maximum value $I_{2\theta,max}$ and a minimum value $I_{2\theta,min}$ of $I_{2\theta}$ in a 2θ range of 18° to 19°, or $(I_{2\theta,max} - I_{2\theta,min})$, as the diffraction intensity of lithium manganate, I.

4. The multilayer piezoelectric element according to claim 1, wherein the piezoelectric ceramic layers further contain at least one type of alkaline earth metal selected from calcium, strontium, and barium, as well as silver.

5. The multilayer piezoelectric element according to claim 4, wherein a total content of the alkaline earth metal is over 0.2 percent by mol but no higher than 5 percent by mol when a content of element in B sites in the alkaline niobate represents 100 percent by mol.

6. The multilayer piezoelectric element according to claim 4, wherein the alkaline niobate is expressed by Composition Formula (1) below:

$$(Ag_u M2_v (K_{1-w-x} Na_w Li_x)_{1-u-v})_a (Sb_y Ta_z Nb_{1-y-z}) O_3 \quad (1)$$

wherein M2 represents the alkaline earth metal, while u, v, w, x, y, z, and a represent values satisfying inequalities expressed by $0.005 < u \leq 0.05$, $0.002 < v \leq 0.05$, $0.007 < u+v \leq 0.1$, $0 \leq w \leq 1$, $0.02 < x \leq 0.1$, $0.02 < w+x \leq 1$, $0 \leq y \leq 0.1$, $0 \leq z \leq 0.4$, and $1 < a \leq 1.1$, respectively.

7. The multilayer piezoelectric element according to claim 1, wherein the piezoelectric ceramic layers further contain Si and its content is 0.1 percent by mol or higher but no higher than 3.0 percent by mol when the alkaline niobate represents 100 percent by mol.

8. The multilayer piezoelectric element according to claim 1, further provided with protective parts that cover the internal electrodes and/or piezoelectric ceramic layers, wherein the protective parts contain lithium manganate.

* * * * *